# (12) United States Patent
Wondrak

(10) Patent No.: US 9,478,955 B2
(45) Date of Patent: Oct. 25, 2016

(54) FEEDTHROUGH DEVICE FOR AN EXPLOSION-PROOF HOUSING

(71) Applicant: R. Stahl Schaltgeräte GmbH, Waldenburg (DE)

(72) Inventor: Tom Wondrak, Künzelsau (DE)

(73) Assignee: R. Stahl Schaltgeräte GmbH, Waldenburg (DE)

( * ) Notice: Subject to any disclaimer, the term of this patent is extended or adjusted under 35 U.S.C. 154(b) by 0 days.

(21) Appl. No.: 14/407,261

(22) PCT Filed: May 3, 2013

(86) PCT No.: PCT/EP2013/059268
§ 371 (c)(1),
(2) Date: Dec. 11, 2014

(87) PCT Pub. No.: WO2013/185979
PCT Pub. Date: Dec. 19, 2013

(65) Prior Publication Data
US 2015/0171606 A1    Jun. 18, 2015

(30) Foreign Application Priority Data

Jun. 13, 2012   (DE) ................. 10 2012 105 113

(51) Int. Cl.
*H02G 3/22* (2006.01)
*H02G 3/06* (2006.01)
(Continued)

(52) U.S. Cl.
CPC ............. *H02G 3/06* (2013.01); *H02G 3/088* (2013.01); *H02G 3/22* (2013.01); *H05K 5/02* (2013.01); *H05K 5/069* (2013.01)

(58) Field of Classification Search
USPC ........................................ 174/650, 653, 668
See application file for complete search history.

(56) References Cited

U.S. PATENT DOCUMENTS 2,972,002 A  *  2/1961  Wayman ............. H02G 3/0616
                                                174/51
3,744,008 A       7/1973  Castellani
(Continued)

FOREIGN PATENT DOCUMENTS

DE        7910840 U1    5/1980
DE       29903103 U1    6/2000
(Continued)

OTHER PUBLICATIONS

International Search Report for corresponding International Application No. PCT/EP2013/059268, dated Oct. 17, 2013, 8 pages.
(Continued)

*Primary Examiner* — Dhirubhai R Patel
(74) *Attorney, Agent, or Firm* — Fitch, Even, Tabin & Flannery LLP

(57) ABSTRACT

A feedthrough device (10) for an explosion-proof housing constructed as a "flameproof enclosure" of the flame protection type. The feedthrough device (10) is arranged in a wall opening of the housing and forms a flameproof gap therein. A rigid component (11) is arranged through said gap to be displaced in its direction of extension relative to the wall. The feedthrough device (10) has a clamping body unit (20), a sleeve (21), a cap (22) and a thrust collar (23). The sleeve (21) and the cap (22) can be screwed together. Axial forces are transmitted between the clamping body unit (20) and the cap (22) via the thrust collar (23). The sleeve (21) exerts a radial clamping force on the clamping body unit (20), which is fully penetrated by a conduit (25) along a longitudinal axis (L), in which conduit a longitudinal section of a component (11) is arranged.

13 Claims, 6 Drawing Sheets

(51) Int. Cl.
*H02G 3/08* (2006.01)
*H05K 5/02* (2006.01)
*H05K 5/06* (2006.01)

(56) References Cited

U.S. PATENT DOCUMENTS

| | | | | |
|---|---|---|---|---|
| 4,030,741 | A * | 6/1977 | Fidrych | F16L 5/00 174/653 |
| 5,037,140 | A * | 8/1991 | Anderson | A62C 35/68 285/139.2 |
| 8,367,944 | B2 * | 2/2013 | Chiou | H02G 3/0691 174/480 |

FOREIGN PATENT DOCUMENTS

| | | |
|---|---|---|
| DE | 19848216 | 9/2001 |
| DE | 202004018347 U1 | 1/2005 |
| DE | 202006011956 U1 | 11/2006 |
| DE | 102010017153 A1 | 12/2011 |
| EP | 0490637 A1 | 6/1992 |

OTHER PUBLICATIONS

Office Action in corresponding German Application No. 10 2012 105 113.5, dated Apr. 17, 2013, 9 pages.

Office action in corresponding Chinese Application No. 2013800309625, dated Jul. 6, 2016, 17 pages.

\* cited by examiner

FEEDTHROUGH DEVICE FOR AN EXPLOSION-PROOF HOUSING

CROSS REFERENCE TO RELATED APPLICATIONS

This patent application is the national phase of PCT/EP2013/059268 filed May 3, 2013, which claims the benefit of German Patent Application No. DE 102012105113.5 filed Jun. 13, 2012.

TECHNICAL FIELD

The invention relates to a feedthrough device for feeding a component, in particular an electrical conductor, through the wall opening of a wall of an explosion-proof housing. The housing is configured, in particular, so as to be in compliance with the ignition protection category "flameproof enclosure (Ex-d)".

BACKGROUND

The feedthrough of the component through the wall opening in the housing must comply with the regulations governing explosion protection. For this, publication DE 299 03 103 U1 suggests a cable entry that is resistant to ignition transmission. The cable entry comprises a metal sleeve that can be screwed into the wall opening of the housing. On the interior of the threaded jacket, there is a slidably arranged sealing ring of thermoplastic polyamide resin. This sealing ring is to achieve a seal radially outward toward the metal sleeve as well as radially inward toward the cable sheathing. A union nut can be screwed onto the threaded sleeve. The threaded sleeve has an interior surface that is conical toward the sealing ring, said interior surface interacting with a conical exterior surface of the sealing ring in order to clamp said sealing ring radially toward the outside on the cable jacket.

Considering this, an improved feedthrough device is to be the object.

SUMMARY

The explosion-proof housing comprises a wall opening through which the component is moved out. The component or the electrical conductor is rigid, in particular in its extension direction, and is, for example a rigid bar that can be configured as an electrical bus bar. Via the bus bar, an electrical potential can be conducted out of the housing and be conducted, for example by an explosion-proof housing, into an adjacent explosion-proof housing. For example, the bus bar may be grounded.

A feedthrough device is arranged in the wall opening and forms a flameproof gap therein. A rigid component is arranged through this gap so as to be displaced in its direction of extension relative to the housing. Due to temperature fluctuations, the length of the component may change. Inasmuch as the component can be displaced relative to the housing wall having the wall opening, the component and the housing are not subject to any loads there. The feedthrough device forms a flameproof gap so that the movability of the component relative to the housing wall is achieved while the protection against explosion is ensured.

Preferably, the feedthrough device is mounted to the component and arranged so as to be displaceable relative to the housing wall and form the flameproof gap. In one embodiment of the invention, the feedthrough device comprises a clamping body unit that encloses the component extending through the wall opening of the housing. This clamping body unit is preferably connected to the fed through component in a positive-locking and/or non-positive locking manner. Due to the forces that usually occur in the extension direction of the component, the feedthrough device is immovably clamped in place relative to the component.

Furthermore, the feedthrough device may also comprise a clamping body unit with a sleeve on which acts a radial clamping force as well as with a cap that can be screwed to the sleeve. In operative position of the feedthrough device, a flameproof gap is formed between the sleeve and the wall opening. The feedthrough device is not rigidly connected to the housing. Preferably, the feedthrough device is mounted only to the passed-through component. The section of the sleeve that forms the flameproof gap with the wall opening has a length in the direction of the longitudinal direction such that the displacements between the component and the wall of the housing at all times form a sufficiently long gap to ensure the prevention of propagation of flame. In this manner, it is possible to very easily feed in particular rigid components such as a power bus or bus bar through the wall opening of a housing and to subsequently, achieve—with the use of the feedthrough device—an explosion-proof passage. A rigid bus bar can also be inserted through or into several housings.

This arrangement of housing and feedthrough device can be produced in a particularly simple manner with an inventive embodiment of the feedthrough device. Preferably, the clamping body unit of the feedthrough device is elastically deformable. Considering the usually occurring forces to which the feedthrough device is exposed, however, there is no plastic deformation of the clamping body unit. The clamping body unit comprises a conduit extending along a longitudinal axis for the accommodation of a longitudinal section of the component fed through the wall opening. Preferably, the clamping body unit is in positive-locking or nonpositive-locking contact with the entire longitudinal section. Furthermore, the clamping body unit has a conical clamping surface extending preferably coaxially about the longitudinal axis. A conical inside surface of the sleeve is adapted to the conicity of the clamping surface. By displacing the sleeve in longitudinal direction, this allows the application of a radial clamping force to the clamping body unit, as a result of which said clamping body unit will deform elastically and, in turn, establish a clamping connection with the longitudinal section extending in the conduit.

The conical clamping surface and the conical inside surface, respectively, can form an annular surface that is closed around the longitudinal axis. Different therefrom, it is also possible for the clamping surface and/or the inside surface to be divided into several surface sections that are broken up or separated by recesses, grooves or the like. Such surface sections may be arranged distributed in peripheral direction about the longitudinal axis.

A screw cap that can be screwed to the sleeve is used for the axial displacement of the sleeve. The cap has a thrust surface that may extend at a right angle or obliquely with respect to the longitudinal axis. A thrust collar is supported by the thrust surface. On the side of the thrust collar opposite the thrust surface, the clamping body unit has a first axial surface that extends at a right angle or obliquely to the longitudinal axis. Consequently, the thrust collar can be used to transmit an axial force between the thrust surface between the cap and the first axial surface. This axial force is supported between the conical interior surface of the sleeve and the clamping surface via the screw connection of the cap with the sleeve and thus effects the radial clamping force.

Consequently, axial forces can be transmitted between the clamping body unit and the cap via the thrust collar. Furthermore, the thrust collar offers the option of preventing the transmission of forces in peripheral direction about the longitudinal axis between the cap and the elastically deformable clamping body unit. As a result of this, it can be ensured that the clamping body unit is not deformed, for example not twisted, in peripheral direction when a screw connection is produced between the sleeve and the cap. As a result of this it is achieved, again, that deformations in peripheral direction are not transmitted by the feedthrough device to the component that is being fed through.

The feedthrough device can be mounted easily. At the same time, a good clamping connection with the component is achieved. On one section of the exterior surface of the sleeve a flameproof gap can be formed relative to the wall of the housing or an intermediate piece arranged in the wall opening. To do so, the sleeve has, in particular, an end section having a cylindrical outside surface.

Preferably, the thrust collar is configured as a sliding ring, as it were. The thrust collar is able to form a sliding bearing relative to the first axial surface and/or relative to the thrust surface of the cap. When the thrust collar is supported in a sliding manner on the first axial surface and/or the thrust surface, it cannot transmit any forces or it can only negligibly small forces and torques in peripheral direction about the longitudinal axis.

Preferably, there is an intermediate space between the sleeve and the thrust collar. This intermediate space may vary in size, viewed in the direction of the longitudinal axis—depending on the desired clamping force. The stronger the thrust collar is clamped in place between the cap and the clamping body unit, the greater is the radial clamping force exerted via the clamping body unit on the longitudinal section of the component in the conduit.

Preferably, the clamping body unit comprises two clamping bodies, each having an abutment surface at which the two clamping bodies abut against each other. In mounted operative position of the feedthrough device, the abutment surfaces of the two clamping bodies are pressed against each other due to the sleeve that is placed on the clamping surface. The two clamping bodies themselves are loosely lying next to each other. Preferably, each clamping body comprises a peripheral section of the conduit. Consequently, the separating location of the clamping body unit between the two clamping bodies extends through the conduit along the entire longitudinal extension of the conduit. Consequently, the two clamping bodies can be attached and positioned at the desired location on opposite sides on the receiving longitudinal section of the component. A displacement of the clamping body unit relative to the component is thus not necessary during assembly. Despite the high clamping forces between the clamping body unit and the component, said unit can still be easily mounted at the desired location without the risk of damage.

In one exemplary embodiment, the abutment surfaces of the clamping bodies are configured as plane surfaces. Preferably, the abutment surfaces of the two clamping bodies abut against each other in one plane that extends through the conduit in the entire longitudinal direction, wherein the longitudinal axis is located specifically in this plane.

The cross-section of the conduit is specifically adapted to the cross-section of the component that is to be received. This adaptation affects in particular the form and size of the cross-section. In one exemplary embodiment, the cross-sections of the conduit and of the longitudinal section of the component are rectangular.

A second axial surface may be present on the clamping body unit. The normal vectors of the first axial surface and the second axial surface extend away from each other, preferably in opposite directions parallel to the longitudinal axis. In doing so, the clamping surface of the clamping body unit may be arranged between the two axial surfaces—viewed in the direction of the longitudinal axis.

The sleeve may have a radially inward extending annular flange that is associated with the second axial surface of the clamping body unit. An axial displacement between the sleeve and the clamping body unit can be delimited by this annular flange. In this manner, it is possible to also limit the clamping force between the clamping body unit and the longitudinal section of the component accommodated in the conduit.

Advantageous embodiments of the invention can be inferred from the dependent patent claims and the description. The description is restricted to essential features of the invention. The drawings are to be used for supplementary reference. Hereinafter, embodiments of the invention are described in detail with reference to the appended drawings. They show in

DETAILED DESCRIPTION

Figure 7:
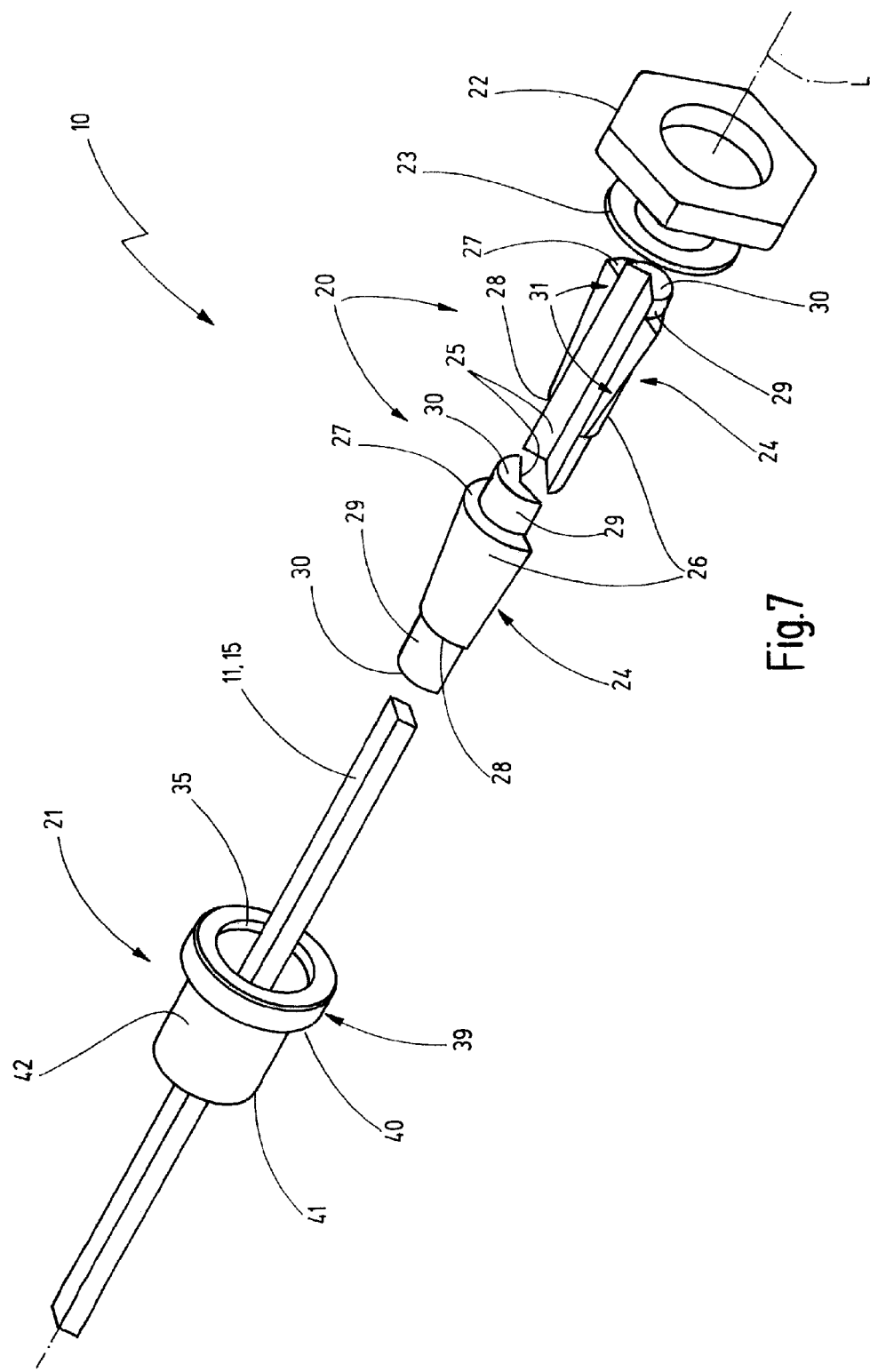
FIG. 7 perspective exploded view of an exemplary embodiment of the feedthrough device.
Figure 8:
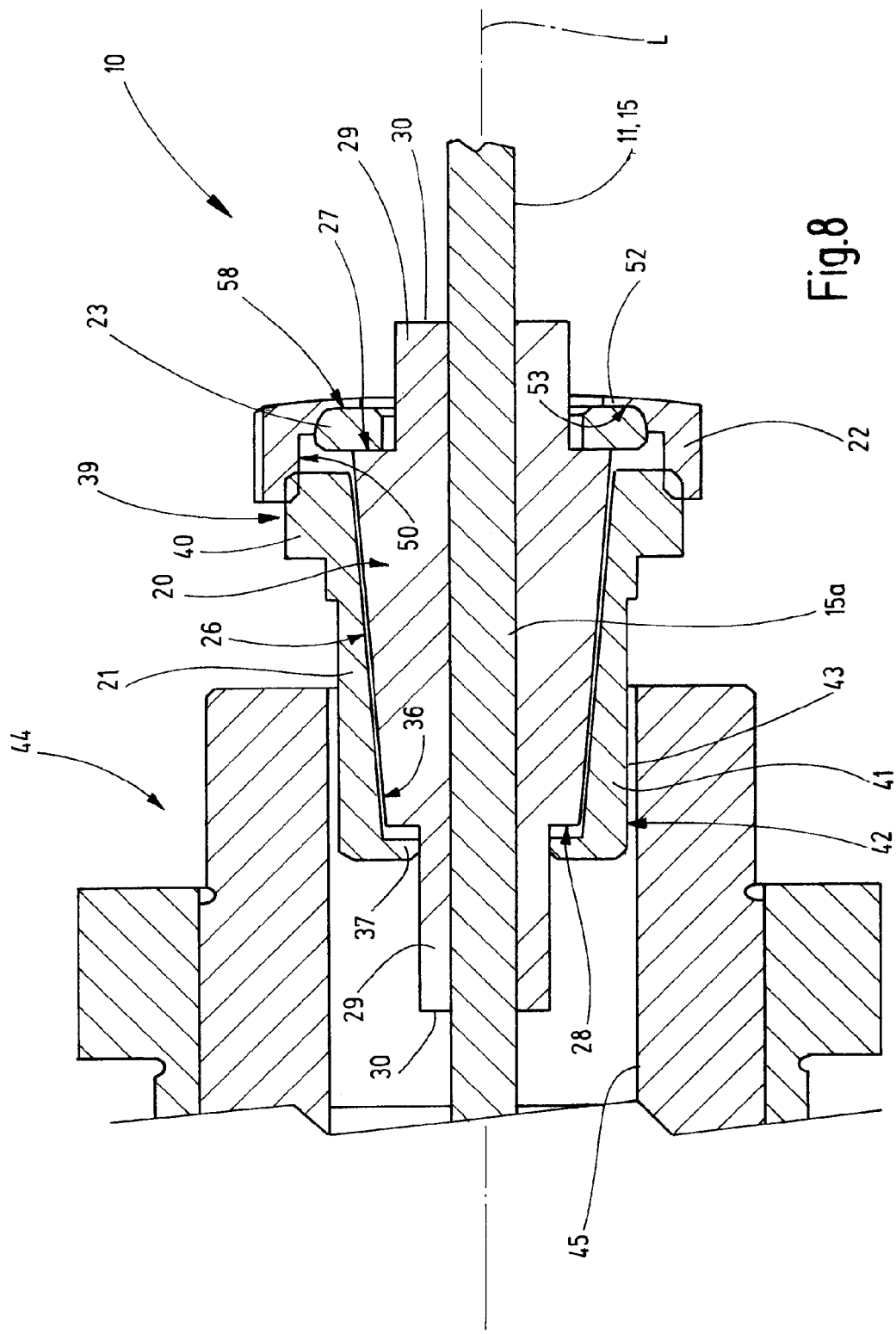
FIGS. 8 and 9 each a longitudinal section through the feedthrough device as in FIG. 7, in mounted state.
Figure 9:
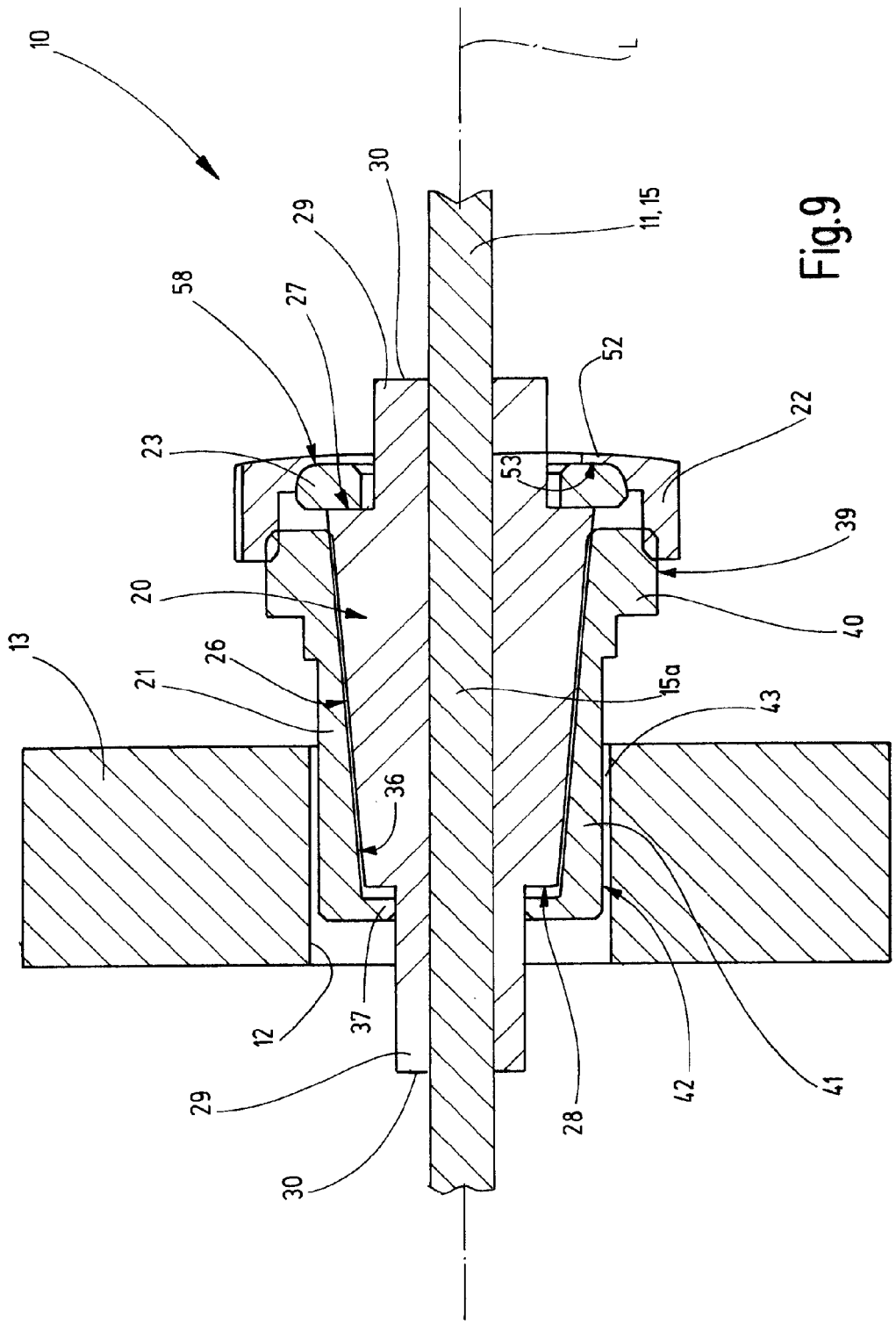

FIGS. 7 through 9 show an exemplary embodiment of a feedthrough device 10. The feedthrough device 10 is disposed for guiding a component, for example a rigid component 11 extending in a longitudinal axis L, through the wall opening 12 we of a wall 13 of a housing 14 in an explosion-proof manner. In accordance with the example, the component 11 is a grounded bus bar 15. Hereinafter, the example of the component mentioned is the bus bar 15, in which case the features explained in this context are also applicable to other components that are rigid in their extension direction, for example. As an alternative to this exemplary embodiment, the feedthrough device 10 can also be used to feed through flexible components, for example electrical cables.

Figure 1:
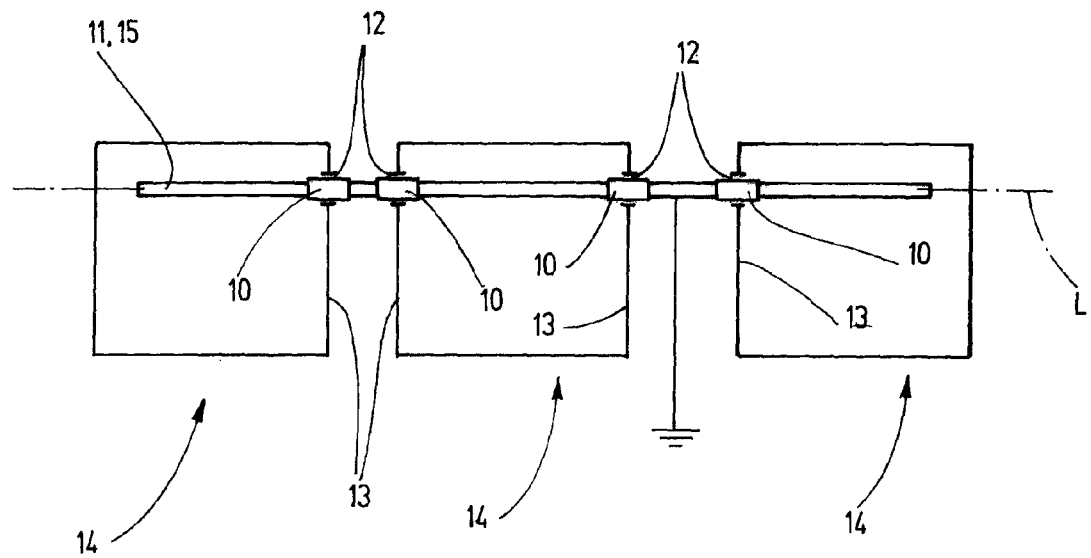
FIG. 1 a schematic representation resembling a block circuit diagram of a bus bar comprising feedthrough devices arranged in the region of the wall of the housing.
Figure 2:
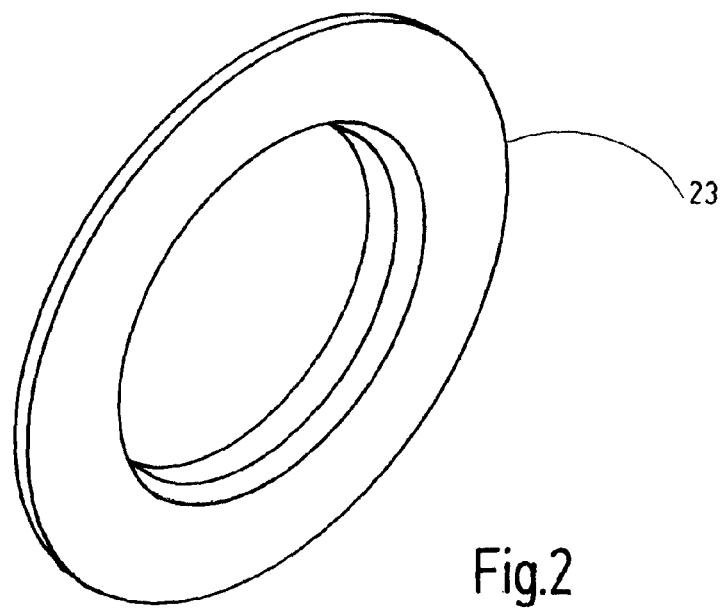
FIG. 2 a perspective illustration of a thrust collar of the feedthrough device.
Figure 3:
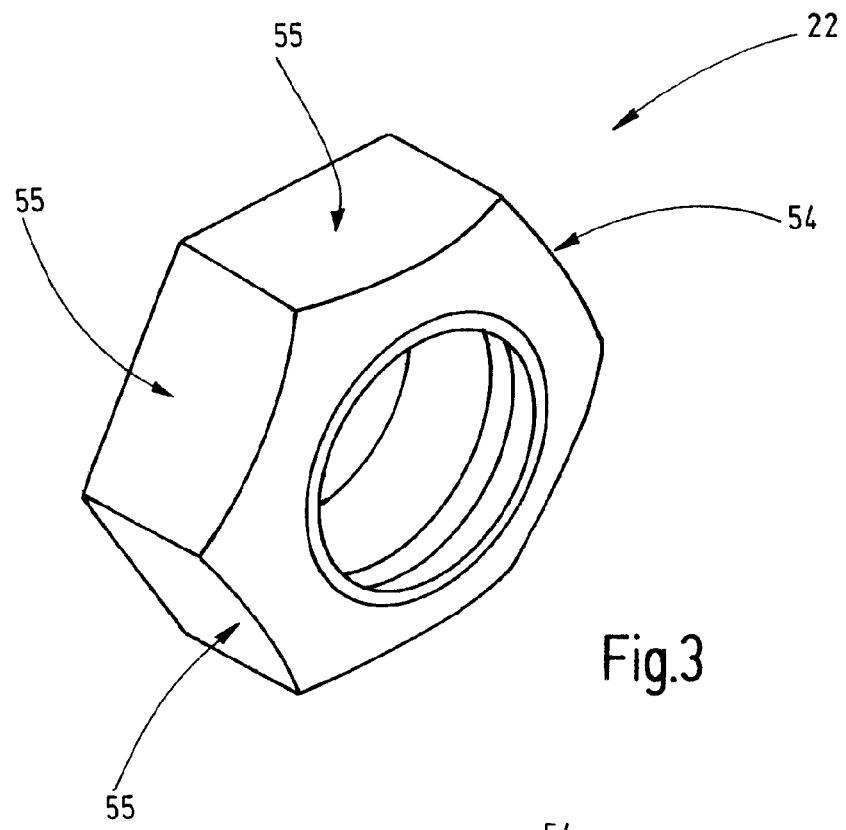
FIG. 3 a perspective illustration of a cap of the feedthrough device.
Figure 4:
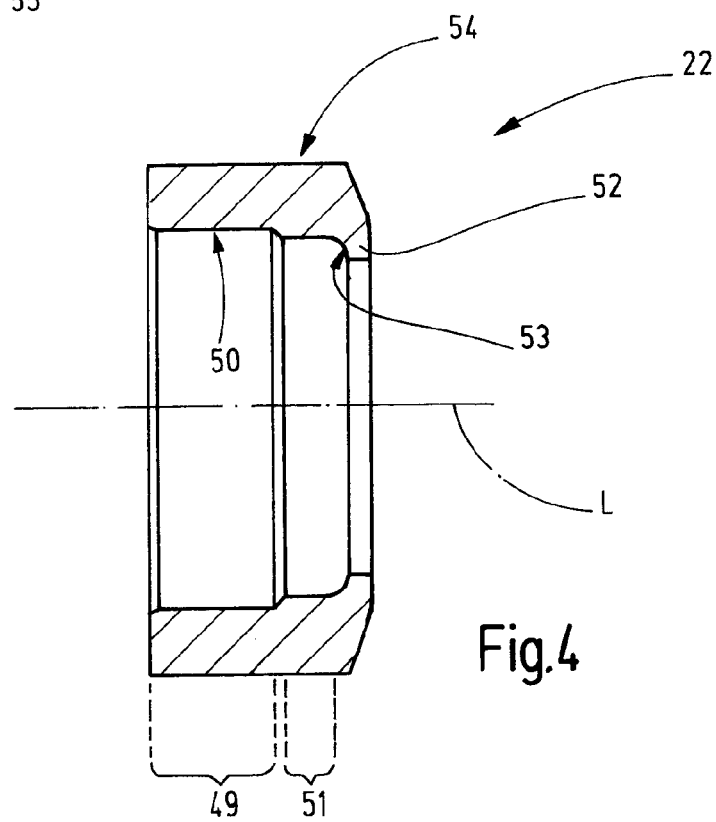
FIG. 4 a longitudinal section of the cap as in FIG. 3.

The highly schematized illustration in FIG. 1 shows each wall opening 12 with respectively one feedthrough device 10 provided therein. With a sufficiently small distance between two adjacent housings 14 it is also possible to use a shared feedthrough device 10 for the explosion-proof feedthrough of the bus bar 15 through the two adjacent wall openings 12.

The bus bar 15 is supported in its extension direction along a longitudinal axis L so as to be shiftable relative to the wall 13 having the wall opening 12. In the wall opening 12, the feedthrough device 10 forms a flameproof gap 43 allowing a shifting in longitudinal direction (FIGS. 8, 9). For this purpose, the feedthrough device 10 can be connected to the wall 13 in a not illustrated exemplary embodiment, in which case the gap 43 is then formed between the feedthrough device 10 and the bus bar 15. In the described exemplary embodiment, the feedthrough device 10 is immovably seated on the bus bar 15 and forms a flameproof gap 43 opposite the wall 13 in the wall opening 12, preferably a circumferential annular gap.

One exemplary embodiment of an inventive feedthrough device 10 is explained hereinafter with reference to FIGS. 2 through 9.

The feedthrough device 10 comprises a clamping body unit 20, a sleeve 21, a cap 22, as well as a thrust collar 23. Preferably, there are no other components. In the exemplary embodiment described here, the clamping body unit 20 is made up of two clamping bodies 24. The clamping body unit 20 is made of two clamping bodies 24. The clamping body unit 20 is divided into two parts, as it were, and—viewed in peripheral direction about the longitudinal axis L—preferably in two halves.

A conduit 25 for the accommodation of a longitudinal section 15a of the bus bar 15 extends along the longitudinal axis L through the clamping body unit 20. The cross-section of the conduit 25 is adapted to the cross-section of the component 11. In the exemplary embodiment described here, the cross-sectional form of the bus bar 15 and thus the conduit 25 are rectangular. The cross-section of the conduit 25 is constant along the entire clamping body unit 20.

The clamping body unit 20 has a clamping surface 26 that is conically tapering in the direction of the longitudinal axis L. The clamping surface 26 corresponds to the lateral surface area of a truncated cone. Adjoining the clamping surface 26—viewed in axial direction of the longitudinal axis L—there is a first annular axial surface 27 on the one side and a second annular axial surface 28 on the other side. In the exemplary embodiment, the two axial surfaces 27, 28 extend in a plane radially with respect to the longitudinal axis L. The normal vectors of the two axial surfaces 27, 28 extend in opposite directions parallel to the longitudinal axis L.

The clamping body unit 20 comprises two cylindrical axial extensions 29, each forming an axial end 30 of the clamping body unit 20. The axial surfaces 27, 28 form annular shoulders or annular steps—as it were—between the clamping surface 26 and the respectively adjacent axial extension 29 of the clamping body unit 20. In the region of the first axial surface 27, the clamping body unit 20 has its largest outside diameter. Starting at the axial surface 27, the clamping body unit 20 tapers along the clamping surface 26 toward the second axial surface 28.

As mentioned, the clamping body unit 20 consists of two separate clamping bodies 24. Each of the clamping bodies 24 comprises a peripheral section of the clamping body unit 20. In accordance with the example, the clamping body unit 20 is divided into two clamping bodies 24 extending in one plane on the longitudinal axis L. Consequently, the conduit 25 is also divided over the two clamping bodies 24 along its entire longitudinal extension. Due to this measure, with the bus bar 15 installed, the clamping body unit 20 can be attached from the opposite sides to the desired mounting location on the bus bar 15, so that the clamping body unit 20 completely encloses the bus bar 15 and accommodates the longitudinal section 15a of the bus bar 15 in the conduit 25.

Each of the two clamping bodies 24 has an abutment surface 31. In assembled state, the respective abutment surfaces 31 of two clamping bodies 24 abut against each other. The abutment surface 31 of each clamping body 24 is divided into two sections that are separated from each other by the conduit section of the conduit 25 provided on the respective clamping body 24. In the exemplary embodiment, the sections of the abutment surface 31 are formed in the region between the two axial surfaces 27, 28.

In mounted state, the abutment surfaces 31 of the two clamping bodies 24 are placed loosely next to each other and are pressed against each other by the sleeve 21. The sleeve 21 is disposed to apply a radial clamping force to the clamping surface 26 of the clamping body unit 20. The clamping body unit 20 and the two clamping bodies 24, respectively, are made of a material that can elastically deform due to the radial forces generated by the sleeve 21. In doing so, a material is selected that does not exhibit any plastic deformations under the usually occurring temperatures to which the feedthrough device 10 is exposed. The material does not exhibit any creep at normal temperature.

Figure 5:
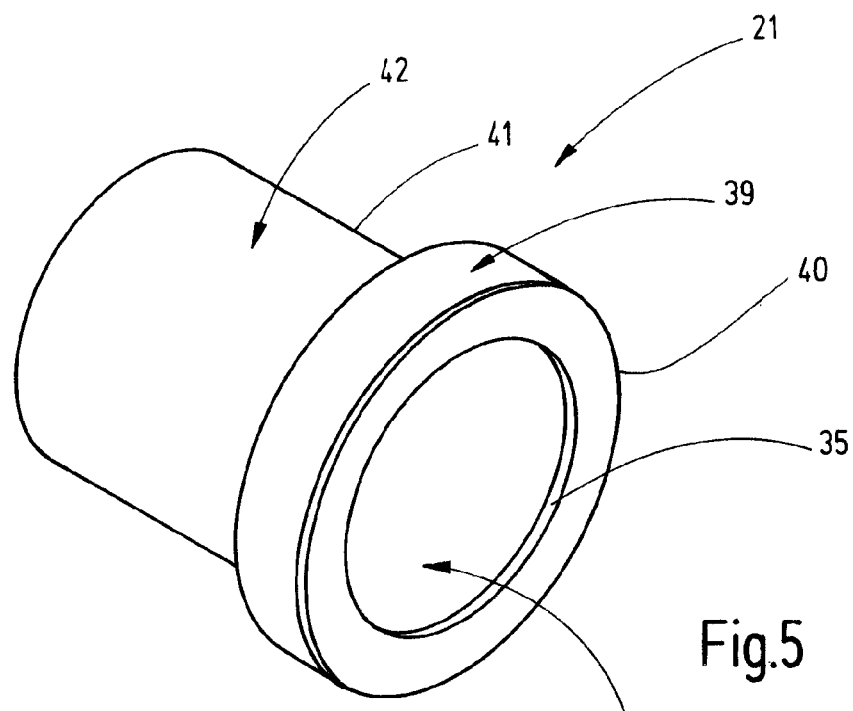
FIG. 5 a perspective illustration of a sleeve of the feedthrough device.
Figure 6:
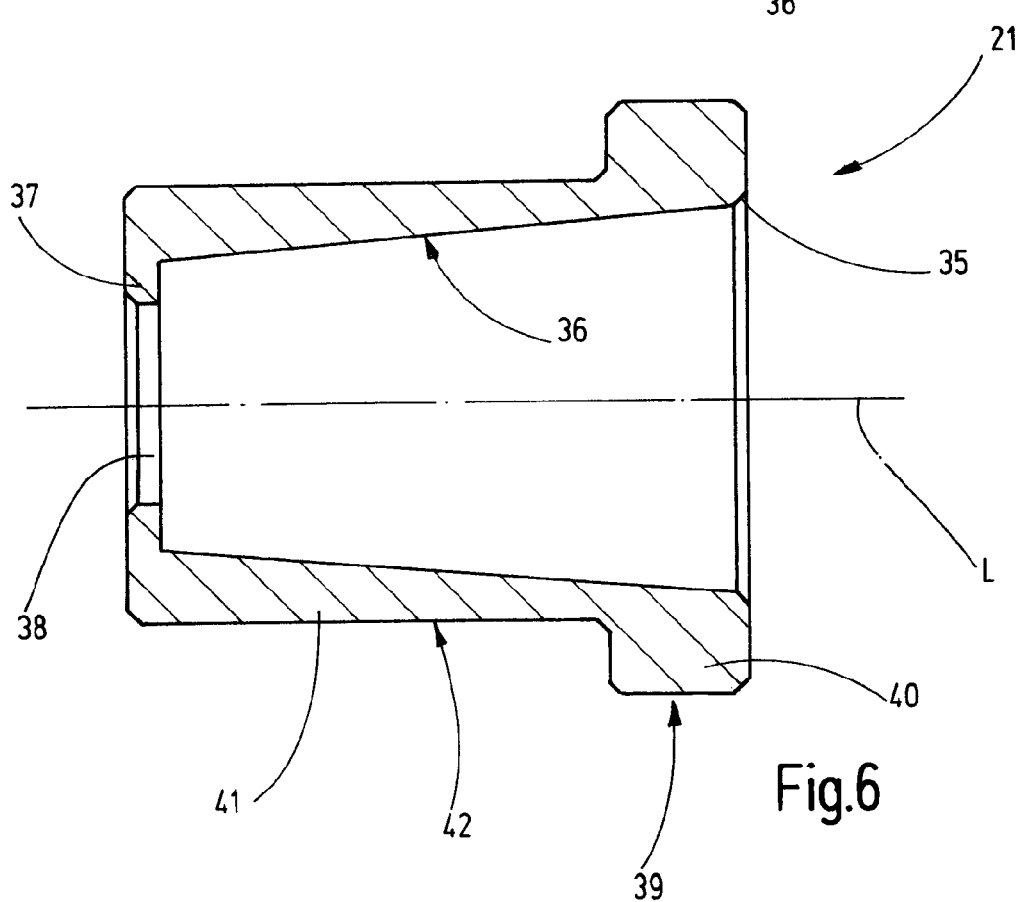
FIG. 6 a longitudinal section of the sleeve as in FIG. 5.

FIGS. 5 and 6 show the sleeve 21 in detail. It has an interior surface 36 that has a conical taper starting from an axial attachment opening 35 in the direction of the longitudinal axis L. On the axial side opposite the attachment opening 35, a radial flange 37 extends radially inward away from the interior surface 36. The radial flange 37 encloses an end opening 38 of the sleeve 21 having a diameter corresponding to at least the outside diameter of the axial extension 29 adjoining the second axial surface 28.

The conicity of the interior surface 36 is adapted to the conicity of the clamping surface 26. When the sleeve 21 is attached by being slipped on the clamping body unit 20, a planar abutment between the interior surface 36 and the clamping surface 26 is produced which, however, need not cover the entire clamping surface 26 and/or the entire interior surface 36. In assembled state, a space may remain between the radial flange 37 and the second axial surface 28. As a result of this, it is ensured that the clamping body unit 20 can be moved toward the radial flange 37 when the cap 22 is screwed on, relative to the sleeve 21. When the radial flange 37 comes into abutment with the second axial surface 28 or the clamping body unit 20, another relative displacement between the clamping body unit 20 and the sleeve 21 in longitudinal direction is prevented. In this way, the clamping force can be delimited.

The sleeve 21 has its greatest inside diameter at the attachment opening 35. An external thread 39 is provided in the region of the attachment opening 35 and, in accordance with the example, directly adjacent to the outside circumference of the sleeve 21. In the exemplary embodiment, the external thread 39 is provided on the exterior annular surface of an annular section 40. The sleeve 21 has its largest outside diameter at the annular section 40.

Adjoining the annular section 40, there is a cylindrical end section 41 of the sleeve 21, said end section having a cylindrical exterior surface 42. Preferably, the cylindrical exterior surface 42 of the end section 41 is disposed to form a flameproof gap 41 in the region of the wall opening 12. This flameproof gap 43 may be formed, for example, directly between the cylindrical exterior surface 42 and the wall area delimiting the wall opening 12. Alternatively thereto, it is also possible to form the flameproof gap 43 between the cylindrical exterior surface 42 and a component 44 that is connected to the wall 13 of the housing 14 in the region of the wall opening 12. To do so, the component 44 may have a cylindrical opening 45 that interacts with the feedthrough device 10, as is schematically illustrated by FIG. 8. For example, the component 44 may make available a cylindrical opening 45 that has a length in the direction toward the longitudinal axis L that is greater than that of the wall opening 12.

The cap 22 of the feedthrough device 10 is disposed to be screwed onto the external thread 39 of the sleeve 21. To accomplish this, the cap 22 has a first hollow cylindrical section 49 having an internal thread 50. Adjoining the first hollow cylindrical section 49 is a second hollow cylindrical section 51 that has a smaller inside diameter. Both hollow cylindrical sections 49, 51 are arranged coaxially relative to the longitudinal axis L. On the side of the second hollow cylindrical section 51 opposite the first hollow cylindrical section 49, there is a radially inward-extending shoulder 52. On the shoulder 52 on the side facing the second hollow cylindrical section 51, there is a thrust surface 53 that may be arranged in a plane radially with respect to the longitudinal axis L or a plane extending obliquely to the longitudinal axis L.

The exterior side 54 of the sleeve 22 is configured in such a manner that it is suitable for the attachment of a commercially available tool. In the exemplary embodiment, the exterior side 54 has six flat surface areas 55 formed in a regular manner in peripheral direction, to which a tool, for example a fork wrench or the like, can be attached in order to produce the screw connection with the sleeve 21.

The thrust collar 23 is arranged between the cap 22 and the clamping body unit 20. In the exemplary embodiment, the thrust collar 23 is at least partially accommodated in the second hollow cylindrical section 51 of the cap 22. Measured in longitudinal direction, the thrust collar 23 may also be somewhat larger than the length of the second hollow cylindrical section 51, so that said collar will minimally extend into the first hollow cylindrical section 49. The outside diameter of the thrust collar 23 is adapted to the inside diameter of the second hollow cylindrical section 51. Consequently, the thrust collar 23 is not in contact with the internal thread 50 of the first hollow cylindrical section 49 of the cap 22 having a larger inside diameter.

In assembled state, the thrust collar 23 is supported by the thrust surface 53 of the sleeve 21. The axially opposite side of the thrust collar 23 abuts against the first axial surface 27 of the clamping body unit 20. In doing so, the thrust collar 23 coaxially encloses the axial extension 29 of the clamping body unit 20, said axial extension adjoining the first axial surface 27. The thrust collar 23 is disposed to transmit an axial force between the cap 22 and the clamping body unit 20. At the same time, said thrust collar forms a sliding bearing 58 with the sleeve 21 of the second hollow cylindrical section 51, as in the example. As a result of this, the thrust collar 23—when the cap 22 is being screwed on the sleeve 21—prevents the transmission of a force or a momentum about the longitudinal axis L to the clamping body unit 20. Torsions of the clamping body unit 20 and thus also the bus bar 15 are thus prevented. Alternatively or additionally, such a sliding bearing could also be provided between the thrust collar 23 and the clamping body unit 20.

The feedthrough device 10 is mounted as follows:

First the bus bar 15 is guided through a wall opening 12 of a wall 13 of a housing 14 and fastened inside the housing or outside the housing 14. In doing so, the bus bar 15 may also extend through several wall openings 12 of different housings 14, as shown by FIG. 1. The sleeve 21, the thrust collar 23 and the cap 22 are placed from one end onto the bus bar 15. The sleeve 21, as well as the thrust collar 23 and the cap 22, have a larger inside cross-section than the bus bar 15, so that they can be moved with zero insertion force along the bus bar 15 to the mounting location.

The two clamping bodies 24 of the clamping body unit 20 are arranged at the desired mounting location from opposite sides about the longitudinal section 15a of the bus bar 15 and placed next to each other with their abutment surfaces 31. Thereafter, the sleeve 21 is slipped from one side and the thrust collar 23 and the cap 22 are slipped from the other side onto the clamping body unit 20, axially along the longitudinal axis L. In doing so, the interior surface 36 of the sleeve 21 comes into abutment with the clamping surface 26. On one side, the thrust collar 23 abuts against the first axial surface 27 and, on the other side, against the thrust surface 53. Between the thrust collar 23 and the sleeve 21 there is an intermediate space or gap in longitudinal direction. The first hollow cylindrical section 49 having the internal thread 50 is screwed onto the external thread 39 of the sleeve 21. In doing so, the thrust collar 23 transmits an axial force in the direction of the longitudinal axis of the cap 22 and the sleeve 21. Due to the axial force, the sleeve 21 applies a clamping force to the clamping body unit 20, via the interior surface 36 extending obliquely relative to the longitudinal axis L. The clamping body unit 20 deforms elastically and adapts to the longitudinal section 15a of the bus bar 15. As a result of this, a positive-locking or nonpositive-locking clamping connection is formed between the feedthrough device 10 and the component 11 and the bus bar 15, respectively.

A connection between the feedthrough device 10 and the housing 14 is not produced. The feedthrough device 10 can be moved or shifted along the longitudinal axis L relative to the housing 14 or the component 44 arranged between the feedthrough device 10 and the housing 14. In this manner, temperature-related shifting between the bus bar 15 and the housing 14 or a component 44 connected to the housing 14 can be compensated.

As shown by FIG. 9, the feedthrough device 10 can be arranged directly in a wall opening 12 of the wall 13 of a housing 14. Preferably, the cylindrical end section 41 with its cylindrical exterior surface 42 is then disposed for the formation of a flameproof gap 43 between the cylindrical exterior surface 42 and the section of the wall 13 delimiting the wall opening 12. Accordingly, such a flameproof gap 43 could also be formed between a cylindrical opening 45 of a component 44 connected to the wall 13 of the housing 14 and the exterior surface 42 of the cylindrical end section 41 of the sleeve 21 (FIG. 8).

The invention relates to a feedthrough device 10 for an explosion-proof housing 14 which is constructed, in particular, in compliance with the ignition protection category "flame-proof enclosure". The feedthrough device 10 is arranged in a wall opening 12 of the housing 14 and forms a flameproof gap 43 therein. A rigid component 11 is arranged through said gap 43 so as to be displaced in its direction of extension relative to the wall 13 of the housing 14. The feedthrough device 10 comprises, in particular, a clamping body unit 20, a sleeve 21, a cap 22 and a thrust collar 23. The sleeve 21 and the cap 22 can be screwed together. Axial forces are transmitted between the clamping body unit 20 and the cap 22 via the thrust collar 23, which axial forces, in turn, are supported on mutually abutting surfaces 26, 36 of the clamping body unit 20 and/or of the sleeve 21 that extend obliquely relative to the longitudinal axis L. The sleeve 21 thereby exerts a radial clamping force on the clamping body unit 20. The clamping body unit 20 is fully penetrated by a conduit 25 along a longitudinal axis L, in which conduit a longitudinal section of a component 11, preferably an electrical conductor, is arranged. Due to the clamping force exerted by the sleeve 21, the clamping body unit 20 is elastically deformed and clamps the feedthrough device 10 in place on the longitudinal section 15a of the component 11, 15. In this way, the feedthrough device 10 can be supported on the component 11, 15 so as to be secured against shifting and, at the same time, be shiftable relative to the housing 14.

LIST OF REFERENCE SIGNS

10 Feedthrough device
11 Component
12 Wall opening
13 Wall
14 Housing
15 Bus bar
15a Longitudinal section
20 Clamping body unit
21 Sleeve
22 Cap
23 Thrust collar
24 Clamping body
25 Conduit
26 Clamping surface
27 First axial surface
28 Second axial surface
29 Axial extension
30 Axial end of the clamping body unit
31 Abutment surface
35 Attachment opening
36 Interior surface
37 Radial flange
38 End opening
39 External thread
40 Annular section
41 Cylindrical end section
42 Cylindrical exterior surface
43 Gap resistant to ignition transmission
44 Component unit
45 Cylindrical opening
49 First hollow cylindrical section
50 Internal thread
51 Second hollow cylindrical section
52 Shoulder
53 Thrust surface
54 Exterior side
55 Surface region
58 Sliding bearing
L Longitudinal axis

The invention claimed is:
1. Explosion-proof housing (14) comprising:
a wall (13) having a wall opening (12) through which a component (11, 15) that is rigid in its direction of extension is guided from an inside of the housing (14) toward an outside,
with a feedthrough device (10) arranged in the wall opening (12), said feedthrough device being supported so as to be shiftable relative to the housing (14), and
wherein a flameproof gap (43) is formed between the feedthrough device (10) and the wall opening (12) or the component (11, 15), wherein the feedthrough device (10) is immovably connected to the component (11, 15) and is slidably connected relative to the housing,
wherein the feedthrough device (10) comprises a clamping body unit (20) enclosing the component (11, 15), a sleeve (21) acting with a radial clamping force on the clamping body unit (20), and a cap (22) that can be fastened to said sleeve.

2. Explosion-proof housing as in claim 1, wherein the housing is constructed in compliance with ignition protection category "flame-proof enclosure".

3. An explosion-proof housing (14) comprising:
a wall (13) having a wall opening (12) through which a component (11, 15) that is rigid in its direction of extension is guided from an inside of the housing (14) toward an outside,
with a feedthrough device (10) arranged in the wall opening (12), said feedthrough device being supported so as to be shiftable relative to the housing (14);
wherein a flameproof gap (43) is formed between the feedthrough device (10) and the wall opening (12) or the component (11, 15);
wherein the feedthrough device (10) is immovably connected to the component (11, 15) and is slidably connected relative to the housing;
wherein the feedthrough device (10) comprises:
a clamping body unit (20) with a conduit (25) extending along a longitudinal axis (L) for accommodation of a longitudinal section (15a) of the component (11, 15) and with a conical clamping surface (26) extending about the longitudinal axis (L);
a sleeve (21) having a conical interior surface (36) having a conicity adapted to the clamping surface (26) of the clamping body unit (20);
a cap (22) that can be fastened to the sleeve (21) and has a thrust surface (53); and
a thrust collar (23) that is arranged between the thrust surface (53) of the cap (22) and a first axial surface (27) of the clamping body unit (20), and that is disposed to transmit axial forces between the thrust surface (53) and the first axial surface (27).

4. The explosion-proof housing as in claim 3, wherein the thrust surface (53) and/or the first axial surface (27) are oriented obliquely or at a right angle relative to the longitudinal axis (L).

5. The explosion-proof housing as in claim 3, further comprising a sliding bearing (58) formed between the thrust collar (23) on one side and the thrust surface (53) and/or the first axial surface (27) on another side.

6. The explosion-proof housing as in claim 3, wherein an intermediate space exists between the sleeve (21) and the thrust collar (23).

7. The explosion-proof housing as in claim 3, wherein the clamping body unit (20) comprises two clamping bodies (24), each having an abutment surface (31) where the clamping bodies (24) abut against each other.

8. The explosion-proof housing as in claim 7, wherein the abutment surfaces (31) are planar surfaces.

9. The explosion-proof housing as in claim 7, wherein the abutment surfaces (31) are lying next to each other in a plane in which extends the longitudinal axis (L).

10. The explosion-proof housing as in claim 3, wherein a cross-section of the conduit (25) is adapted to a cross-section of the component (11, 15) that is to be accommodated.

11. The explosion-proof housing as in claim 3, wherein the clamping surface (26) of the clamping body unit (20), viewed along the longitudinal axis (L), is arranged between the first axial surface (27) and a second axial surface (28) of the clamping body unit (20).

12. The explosion-proof housing as in claim 11, wherein the sleeve (21) has a radially inward-extending annular flange (37) axially adjoining the interior surface (36), said annular flange being associated with the second axial surface (28).

13. The explosion-proof housing as in claim 3, wherein a section (42) of the exterior surface of the sleeve (21) and an opening (12, 45) in the housing (14) cooperatively form the flameproof gap (43).

* * * * *